(12) United States Patent
Jeon et al.

(10) Patent No.: US 6,574,107 B2
(45) Date of Patent: Jun. 3, 2003

(54) STACKED INTELLIGENT POWER MODULE PACKAGE

(75) Inventors: O-seob Jeon, Seoul (KR); Gi-young Jeon, Bucheon (KR); Seung-yong Choi, Seoul (KR); Seung-won Lim, Anyang (KR); Seung-jin Kim, Buchon (KR); Eul-bin Im, Bucheon (KR); Byeong Gon Kim, Buchon (KR)

(73) Assignee: Fairchild Korea Semiconductor Ltd., Kyungki-do (KR)

( * ) Notice: Subject to any disclaimer, the term of this patent is extended or adjusted under 35 U.S.C. 154(b) by 33 days.

(21) Appl. No.: 09/791,629

(22) Filed: Feb. 26, 2001

(65) Prior Publication Data
US 2002/0057553 A1 May 16, 2002

(30) Foreign Application Priority Data
Nov. 10, 2000 (KR) .......................... 2000-66825

(51) Int. Cl.⁷ ................................. H05K 7/20
(52) U.S. Cl. ................... 361/709; 361/704; 361/707; 361/719; 257/706; 257/717; 174/52.2
(58) Field of Search ................. 361/702–710, 361/721–728, 732–736, 748–756, 760, 765, 772–774, 777–778, 730, 717–719; 257/678, 683, 686, 689, 679, 690–698, 607, 706–727, 666, 687, 692, 701; 174/52.1, 52.2, 252, 256, 16.3, 52.4; 165/80.2, 803, 185; 363/144, 146, 147

(56) References Cited

U.S. PATENT DOCUMENTS

| | | | | |
|---|---|---|---|---|
| 4,047,242 A | * | 9/1977 | Jakob et al. | 361/389 |
| 4,965,710 A | * | 10/1990 | Pelly et al. | 363/56 |
| 5,057,906 A | * | 10/1991 | Ishigami | 357/80 |
| 5,291,065 A | * | 3/1994 | Arai et al. | 257/723 |
| 5,610,799 A | * | 3/1997 | Kato | 361/752 |
| 5,703,399 A | | 12/1997 | Majumdar et al. | |
| 5,767,573 A | * | 6/1998 | Noda et al. | 257/678 |
| 5,966,291 A | * | 10/1999 | Baumel et al. | 361/707 |
| 6,144,571 A | * | 11/2000 | Sasaki et al. | 363/144 |
| 6,272,015 B1 | * | 8/2001 | Mangtani | 361/707 |
| 6,313,598 B1 | * | 11/2001 | Tamba et al. | 318/722 |

FOREIGN PATENT DOCUMENTS

| | | | | | |
|---|---|---|---|---|---|
| JP | 405226575 A | * | 9/1993 | | H01L/25/04 |
| JP | 406181286 A | * | 6/1994 | | H01L/25/065 |
| JP | 409008223 A | * | 1/1997 | | H01L/25/07 |
| JP | 02001156253 A | * | 6/2001 | | H01L/25/07 |

\* cited by examiner

Primary Examiner—Michael Datskovsky
(74) Attorney, Agent, or Firm—Rothwell, Figg, Ernst & Manbeck

(57) ABSTRACT

A stacked intelligent power module package is provided. The intelligent power module package of the present invention includes a power unit including a heat sink and a control unit which is separately manufactured from the power unit and is subsequently stacked on the power unit. The power unit and the control unit of the intelligent power module package are stacked in two different ways including stacking two wire-bonded leadframes of the power unit and the control unit and stacking two separate semiconductor packages of the power unit and the control unit by using locking means formed in each of the semiconductor packages after a trimming/forming process and an electrical property test are finished.

18 Claims, 3 Drawing Sheets

STACKED INTELLIGENT POWER MODULE PACKAGE

BACKGROUND OF THE INVENTION

1. Field of the Invention

The present invention relates to a semiconductor package, and more particularly to a power module package.

2. Description of the Related Art

A conventional semiconductor package is used after being mounted with one or more semiconductor chips on a chip pad in a lead frame, sealed hermetically with an epoxy molding compound (EMC) to protect the parts therein, and installed on a printed circuit board.

As the speed, storage capacity and integration density of electric machines increases, power devices are required to be smaller and lighter. Moreover, a power device must make less noise and ensure high reliability, so that an intelligent power module package having a plurality of chips used in a power device and a control device in one semiconductor package becomes more common.

FIG. 1 is a sectional view illustrating an intelligent power module package formed by a conventional method. The power module package illustrated in FIG. 1, is disclosed in U.S. patent application No. 5,703,399, entitled "Semiconductor Power Module", filed on Dec. 30, 1997 by Mitsubishi Corp. Referring to FIG. 1, the power module package has a molded shape, in which a chip 51 for a power device and a chip 53 used in a control device are mounted on a flat leadframe 58, and are bonded to the leadframe 58 with wires 54. In FIG. 1, reference numerals 52 and 57 indicate a metal mold and an EMC respectively, which are used in a first molding process, and 55 and 56 indicate a heat sink and another EMC, respectively. The other EMC 56 is formed in a second molding process and serves as an insulating layer between the heat sink 55 and the leadframe 58. Reference numeral 59 indicates a metal molding used in the second molding process to form the above insulating layer 56.

However, power module packages formed by a conventional method have many problems. Firstly, in the case of a power module package mounted with many chips, to mount a plurality of chips on a flat leadframe, the size of the leadframe and the power module package must increase. But, a large-sized power module package can increase manufacturing costs for assembly. Moreover, a large-sized power module package can cause chip cracking and package warping. Also, it decreases yield, and brings about problems associated with reliability, such as performance deterioration.

Secondly, in forming the insulating layer 56 insulating the leadframe 58 from the heat sink 55 during the second molding process, the thickness of the insulating layer 56 must be as thin as possible to improve the heat property of the power module package. However, if the insulating layer 56 is made to be too thin, the flow of an EMC deteriorates during the second molding process, so that the EMC cannot fill up the space between the leadframe 58 and the heat sink 55 and an air gap (not shown) may easily be formed. The air gap is a major factor which deteriorates the heat property of the power module package by blocking a heat conducting passage between the leadframe and the heat sink. On the other hand, if the insulating layer 56 is made to be thick, it partially blocks heat in the heat conducting passage which connects the chip 51 used in a power device to the leadframe 58 and the heat sink 55, thereby deteriorating the heat property of the power module package.

Thirdly, in case of a power module package formed by a conventional method, two separate molding processes are performed to prevent the package from warping. However, the two molding processes increase the time taken to manufacture the power module package, thereby increasing the cost of production in an assembling process.

Fourthly, a power module package is divided into two parts including a power unit having the chip 51 used in a power device, and a control unit having the chip 53 used in a control device. After the power module package is molded, it is impossible to test the electrical property of the power module package at any time up until the package is processed by a trimming/forming process. Therefore, there is a problem in which if one of the two parts become deteriorated after the trimming/forming process is finished, the power module would be totally defective. Moreover, during processes which precedes the trimming/forming process, it is impossible to perform an interim test without breaking the power module package, so that the yield may be decreased.

SUMMARY OF THE INVENTION

It is therefore an object of the present invention to provide an intelligent power module package which can improve the heat property, yield, and reliability and reduce the manufacturing costs by forming the intelligent power module package according to a method in which a power unit and a control unit are separately manufactured and are subsequently stacked.

To achieve the above object of the invention, an intelligent power module package according to an aspect of the present invention, includes a power unit including a heat sink and a control unit is manufactured separately from the power unit and is subsequently stacked on the power unit. Here, the power unit and the control unit which are not processed by a soldering process yet, can be manufactured separately until a wire bonding process is completed or until a trimming/forming process and an electric property test are completed.

Preferably, in the case of an intelligent package having a power unit and a control unit which are separately manufactured until a wire bonding process is completed, the leadframe used in the wire-bonded control unit, is molded so that it is stacked on the leadframe used in the wire-bonded power unit, to form a semiconductor package. Here, the leadframes of the power unit and the control unit are electrically connected with each other in a soldering process performed after the molding process.

It is preferable that in the case of an intelligent package having a power unit and a control unit which are separately manufactured until an electric property test is completed, locking means formed in each of the semiconductor packages of the power unit and the control unit connects the two semiconductor packages, thereby forming one semiconductor package. The leadframes of the power unit and the control unit are also connected with each other in the soldering process.

According to a preferred embodiment of the present invention, instead of being bonded too early, the above heat sink is bonded to the leadframe by inserting an insulating layer under the lower part of the leadframe during a molding process.

According to the present invention, it is possible to improve the heat property, the yield, and the reliability of an intelligent power module package, and to reduce the manufacturing costs, by forming the intelligent power module package in a method in which a power unit and a control unit are separately manufactured and are subsequently stacked.

DETAILED DESCRIPTION OF THE PRESENT INVENTION

Hereinafter, preferred embodiments of the present invention will be described in detail with reference to the attached drawings.

The locking means as mentioned in the specification is a general locking means, and is not confined to the specific form illustrated in the diagrams of the embodiments. The present invention can be carried out in many different ways. For example, in a preferred embodiment below, the locking means of semiconductor packages used for a power unit and a control unit is an insertion type, but any type of locking means can be allowed.

In an intelligent power module package according to a first embodiment of the present invention, a power unit and a control unit are separately manufactured until a wire bonding process is completed, and then are stacked. On the other hand, in an intelligent power module package according to a second embodiment of the present invention, a power unit and a control unit which have not yet been processed by a soldering process are separately manufactured to form their own semiconductor packages until a trimming/forming process and an electrical property test are completed, and are stacked by using their own locking means.

First Embodiment

Intelligent Power Module Package With Stacked Leadframes

Figure 1:
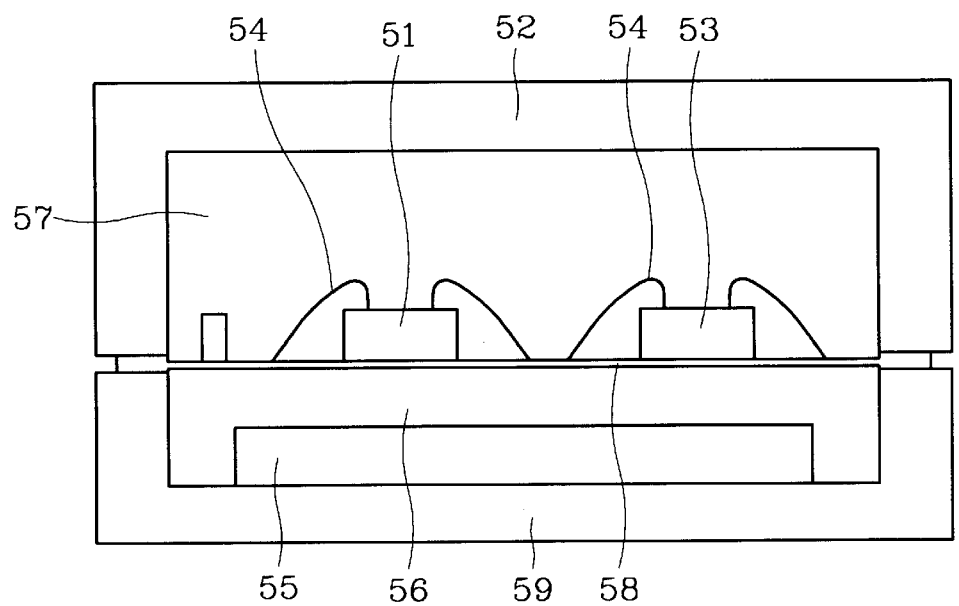
FIG. 1 is a sectional view illustrating an intelligent power module package formed by a conventional method.
Figure 2:
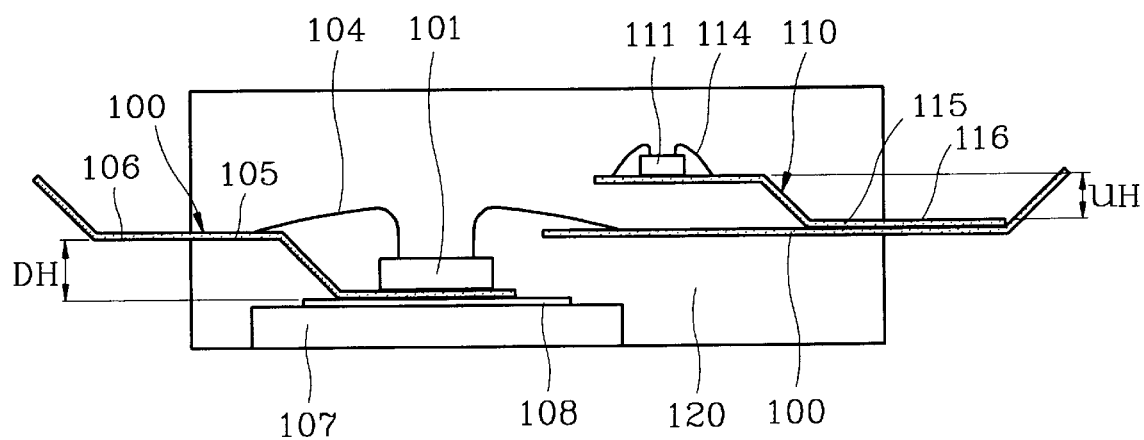
FIGS. 2 and 3 are sectional views illustrating an intelligent power module package and a method for manufacturing the same according to a first embodiment of the present invention.
Figure 3:
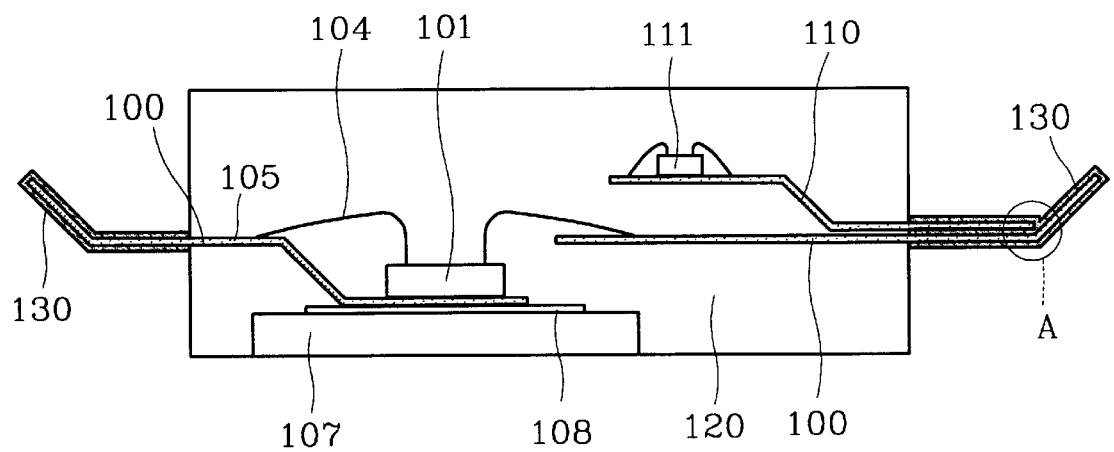

FIGS. 2 and 3 are cross sectional views illustrating an intelligent power module package and a method for manufacturing the same according to a first embodiment of the present invention.

Referring to FIG. 2, the structure and the elements of an intelligent power module package according to a first embodiment of the present invention, will be described.

In FIG. 2, an intelligent power module package according to a first embodiment of the present invention, includes a power unit, a heat sink 107, control unit and a sealing material 120. In the power unit, a chip 101 used in the power unit is bonded to a leadframe 100 of the power unit, which has a plurality of leads 105 and 106 formed at both of its sides and a chip pad formed in a down-set (DH of FIG. 2) with a depth (DH) range of 1–2 mm, and the chip 101 used in the power unit is bonded to each of a plurality of leads 105 with wires 104. Here, reference numerals 105 and 106 indicate an inner lead sealed with a sealing material 120, and an outer lead which is exposed to the outside of the sealing material 120 and is covered with solder (130 of FIG. 3), respectively.

The heat sink 107 which is made of one selected from a metal and a ceramic containing Al or Cu, conducts the heat generated during the operation of the chip 101 used in a power device to the outside of an intelligent power module package through the chip pad of the leadframe 100. The heat sink 107 is bonded to the bottom side of the above chip pad by using an adhesive insulating layer 108. Preferably, the insulating layer 108 is formed of one selected from polyimide and epoxy which exhibit excellent heat-resistance at a temperature of 350° C. or less, to prevent the insulating layer 108 from being transformed by the heat generated during a die attaching process or a wire bonding process.

The control unit is manufactured separately from the power unit until a wire bonding process is completed, and is subsequently stacked on one lead such as the right lead among the two leads formed at both sides of the leadframe 100 of the power unit, thereby forming an intelligent power module package in an integrated shape. In the control unit, a chip 111 used in a control device is bonded to a chip pad on a leadframe 110 of the control unit including an up-set chip pad (UH of FIG. 2) with a up-set height (UH) range of 0.5–1 mm, an inner lead 115 and a bond pad (not shown) of the chip 111 used in a control device is bonded with wires 114.

The above sealing material 120 which is a widely used epoxy molding compound (EMC), seals together the inner lead 105, the chip 101 and the wires 104 of the power unit, and the inner lead 115, the chip 111 and the wires 114 of the control unit together, and also seals every portion except the bottom side of the heat sink 107 and the insulating layer 108, so that it can protect the inner part of an intelligent power module package from external shock and vibration.

Two different methods for manufacturing an intelligent power module package according to the first embodiment of the present invention will be described with reference to FIG. 3.

In a first case for manufacturing an intelligent power module package, a heat sink 107 is bonded to a leadframe of a power device by using an adhesive insulating layer 108. The leadframe 100 of a power device, has a chip pad in a down-set region, and a plurality of leads formed on both of its sides. The chip 101 used in a power device is bonded to the chip pad of the leadframe 100 with a bonding means (not shown) such as epoxy. A bond pad (not shown) of the chip 101 used in a power device and an inner lead 105 of the leadframe 100 of a power unit are bonded together with wires 104. The manufacturing process of the control unit is different from that of the power unit. To manufacture the control unit, first of all, a leadframe 110 in which there is an up-set region and an inner lead 115 and an outer lead 116 in only one direction, is prepared. Next, a chip 111 used in the control unit is bonded to a chip pad of the leadframe 110, and then the edge of the inner lead 115 and a bond pad (not shown) of the chip 111 used in a control device are bonded together with wires 114.

The leadframe 100 of the power unit, which is wire-bonded, is loaded into a metal mold of a molding equipment. Here, the leads 115 and 116 on the leadframe 110 of the wire-bonded control unit are stacked on the leads 105, 106 placed in the right side of the leadframe 100 of the power unit. A special jig prepared in the molding equipment is used in stacking the leadframe 110 of the control unit. After the leads are stacked, a liquid sealing material 120 such as an epoxy molding compound (EMC), is poured into the metal mold of a molding equipment to manufacture an intelligent power module package integrating the power unit and the control unit.

Next, a deflash process, a trimming/forming process, and a soldering process are sequentially performed according to a well-known method. However, in the soldering process according to the present invention, two processes of coating outer leads 106 and 116 with a solder layer 130, and electrically connecting a region (A of FIG. 3) where the power unit and the control unit are stacked and the outer leads 106 and 116, are performed. The above solder layer 130 is preferably made of an alloy consisting of Pb and Sn. After the soldering process is over, the separately manufactured power unit and the control unit are assembled into a complete intelligent power module package. Finally, the intelligent power module package undergoes an electric property test using a common method, and then the packaging process is completely over.

Referring to FIG. 3, a method for manufacturing an intelligent power module package will be described according to a second case of the first embodiment of the present invention. The second case differs from the first in the bonding process of a heat sink, however, the manufacturing process of the second is almost identical to that of the first. Thus, differences between the two cases will be described in detail.

In the second case, a power unit is formed by the same process as that of the first case, and a leadframe 100 of the power unit where a heat sink 107 is not bonded, is used in forming the power unit. Next, a control unit is formed by the same process as that of the first case. After the power unit and the control unit are formed, they are integrated by a molding process, but the heat sink 107 which has an insulating layer 108 bonded thereto, is loaded at the bottom of the inner part of a metal mold. The leadframe 100 of the power unit and the leadframe 110 of the control unit are loaded to be stacked by the same method as that of the first case described above, and a sealing material 120 is subsequently poured into the metal mold, so that an intelligent power module package integrating the power unit, the control unit and the heat sink can be manufactured. The subsequent processes are the same as those of the first case, and thus they will not be described.

Second Embodiment

Intelligent Power Module Package With Stacked Semiconductor Packages

Figure 4:
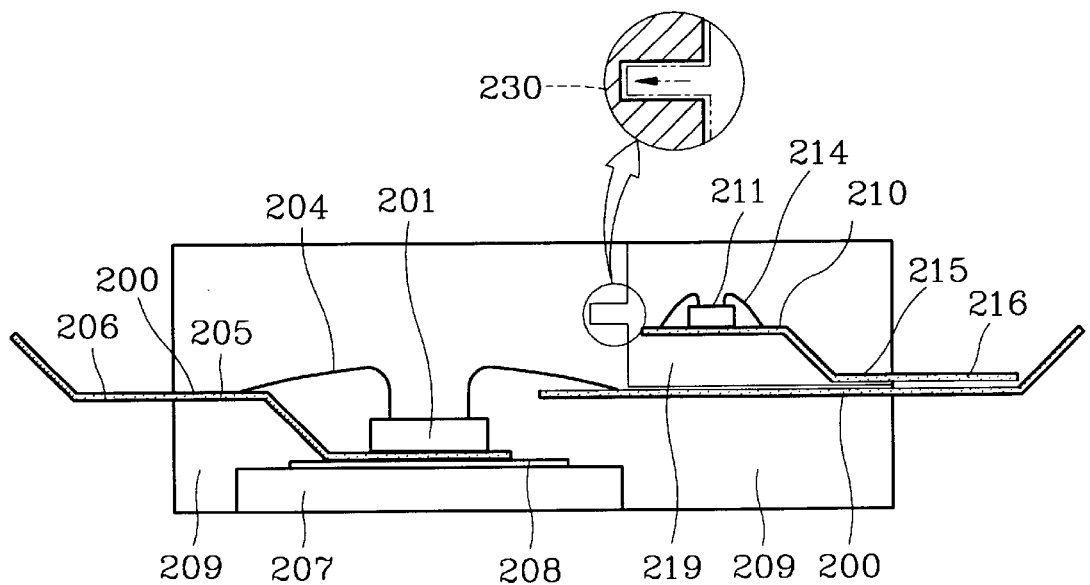
FIGS. 4 and 5 are sectional views illustrating an intelligent power module package and a method for manufacturing the same according to a second embodiment of the present invention.
Figure 5:
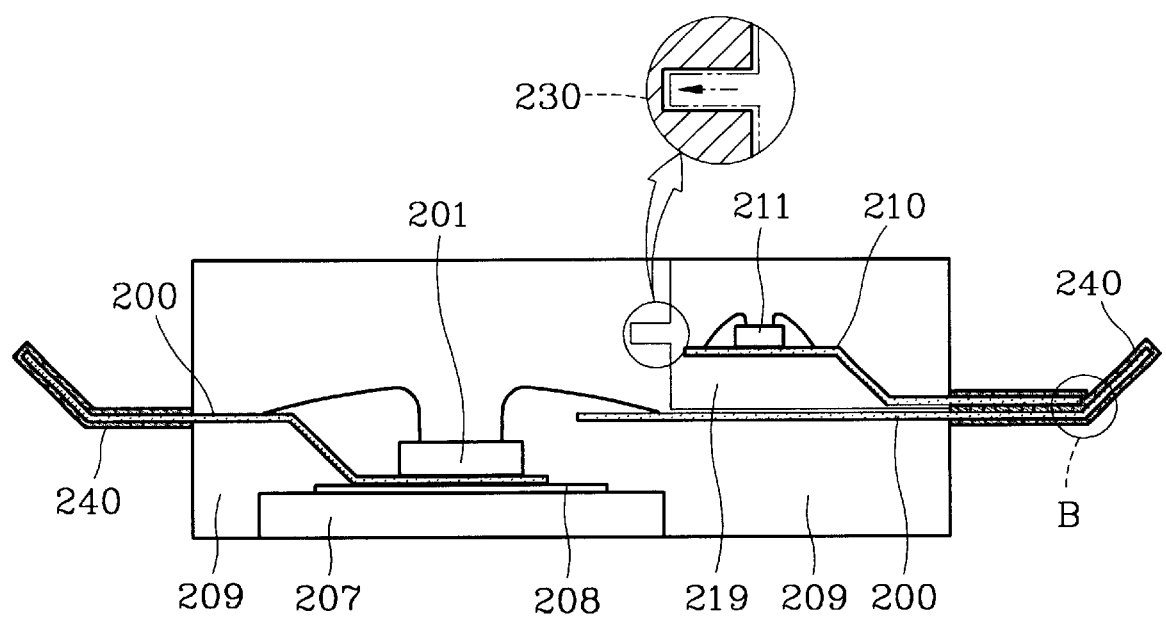

FIGS. 4 and 5 are cross sectional views illustrating an intelligent power module package and a method for manufacturing the same, according to a second embodiment of the present invention.

Here, a leadframe used in the second embodiment of the present invention, is the same as that of the first embodiment and parts of the second embodiment that are the same as those of the first embodiment will not be described.

Referring to FIG. 4, an intelligent power module package according to the second embodiment of the present invention includes two semiconductor packages of a power unit and a control unit, which are already processed by a molding process, a trimming/forming process, and an electrical property test. The two semiconductor packages are integrated into one semiconductor package by using a locking means 230 which is an inserting type.

The above semiconductor package of the power unit includes a leadframe 200 which has a down-set region and leads 205 and 206 formed at both of its sides a heat sink 207 which is bonded to the leadframe by an intervening insulating layer 208 between the heat sink and the bottom side of the down-set region, a chip 201 used in a power device bonded to a chip pad on the leadframe 200, wires 204 which connect a bond pad of the chip 201 used in a power device and an inner lead 205 of the leadframe, and a sealing material 209 which seals the inner lead 205, the chip 201 used in a power device, the wires 204 and every portion of the heat sink 207 except the bottom side. The sealing material 209 is not a usual type, but has a space where the semiconductor package of a power device can be bonded, and a hole where an inserting projection which acts as a locking means 230 can be inserted.

On the other hand, the semiconductor package of the control unit includes a leadframe 210 where there is an up-set region and leads 215 and 216 in one direction, a chip 211 used in a control device, bonded to a chip pad on the leadframe 210, wires 214 which connect a bond pad of the chip 211 used in a control device and an inner lead 215 of the leadframe 210, and a sealing material 219 which seals the inner lead 215 of the leadframe 210, the chip 211 used in a control device, and the wires 214.

The sealing material of the semiconductor package of the control unit has a shape appropriate for being stacked on the semiconductor package of the power unit. Moreover, the sealing material 219 has an inserting projection which acts as a locking means and can be inserted into the hole of the semiconductor package of the power unit.

According to the present embodiment, after an electric property test is completed, the two semiconductor packages of the power unit and the control unit are integrated into an intelligent power module package by using locking means. Therefore, it is possible to find and remove inferior goods before the integration of the two semiconductor packages. Thus, partial defects such as a defective control unit or a defective power unit can be detected during the manufacture of an intelligent power module package, thereby enhancing the total yield.

Two different methods for manufacturing an intelligent power module package according to the second embodiment of the present invention will be described with respect to FIGS. 4 and 5.

In a first case of manufacturing an intelligent power module package according to the second embodiment of the present invention, a leadframe 200 of a power unit, which has a down-set region and leads 205 and 206 formed at both of its sides, is prepared. Here, a heat sink 207 is bonded to the leadframe 200 by using an insulating layer 208. Next, a chip 201 used in a power device is bonded to a chip pad on the leadframe 200 of a power unit, and then a bond pad of the chip 201 used in a power device and an inner lead 205 of the leadframe 200 is bonded together with wires 204.

Subsequently, a molding process is performed using a sealing material 209 to form a locking means and a space, where a semiconductor package of a control unit can be inserted. Next, a deflash process and a trimming/forming process are performed, and when they are finished, an electric property test is performed to find and remove inferior goods during the manufacture of a semiconductor package of the power unit.

On the other hand, a semiconductor package of a control unit is assembled differently from the semiconductor package of a power unit.

To make the semiconductor package of a control unit, a leadframe 210 of a control unit, which has an up-set region and leads 215 and 216 formed in only one direction, is prepared. Next, a chip 211 used in a control device is bonded to the leadframe of a control unit, and a bond pad of the above chip 211 used in a control device is connected to an inner lead 215 of the leadframe 210 by a bonding process with wires 214.

After the wire bonding process is completed, a molding process is performed to form a locking means such as an inserting projection which can be bonded to the semiconductor package of a power unit, and a trimming/forming process and an electrical property test is performed to remove defective items, thereby assembling the semiconductor package of a control unit.

The semiconductor package of a power unit processed by the electrical property test, and the semiconductor package of a control unit are integrated by using a locking means 230, such as the inserting projection and the hole, and are stacked to form an intelligent power module package. Finally, a soldering process in which the leadframe of a power unit is electrically connected to the leadframe of a control unit which is stacked on the above leadframe, is performed. In the soldering process, outer leads 206 and 216 are coated with solder, thereby forming a solder layer 240 which connects (B of FIG. 5) outer leads 206 and 216.

In a second case of manufacturing an intelligent power module package according to the second embodiment of the present invention, the heat sink 207 is not bonded to the leadframe 200 of a power unit at the start. In other words, the heat sink is bonded to the leadframe 200 during a molding process as in the first embodiment. The other processes of the second method are the same as those of the first method, thus they will not be described.

According to the present invention, to form a semiconductor package, the power unit and the control unit of an intelligent power module package are manufactured separately from each other, and are subsequently stacked. Therefore, firstly, the heat property of an intelligent power module package can be effectively improved, by allowing easy adjustment of the thickness of an insulating layer formed of polyimide or epoxy in the intelligent power module package.

Secondly, in case of an intelligent power module package with stacked semiconductor packages, defective goods can be removed by performing an electrical property test before the integration of two semiconductor packages of a power unit and a control unit, thereby enhancing the total yield.

Thirdly, a leadframe where a power unit and a control unit can be stacked is used instead of using a flat leadframe, thereby reducing the size of an intelligent power module package. If the size decreases, the amount of raw materials used can also be reduced and thereby cut down the manufacturing costs. Moreover the reliability of a power module can be improved by reducing the occurrence of a process defects such as package warping, which easily occur in large-sized packages.

While this invention has been particularly shown and described with reference to preferred embodiments thereof, it will be understood by those skilled in the art that various changes in form and details my be made therein without departing from the spirit and scope of the invention as defined by the appended claims.

What is claimed is:

1. An intelligent power module package comprising:
    a power unit, where a chip used in a power device is bonded to a chip pad of a leadframe having a down-set region and leads formed at both of its sides, and the chip used in a power device is also bonded to each of the leads with wires,
    a heat sink which is bonded to the back side of the leadframe of the power unit by interposing an insulating layer;
    a control unit, where another leadframe which is different from the above leadframe of the power unit and has leads formed in one direction, is stacked on the leads in one of both sides of the leadframe of the power unit, and is electrically connected to the leadframe of the power unit, and a chip used in a control device is bonded on a chip pad of the leadframe having an up-set region, with wires; and
    a sealing material which seals a portion of the leadframe of the power unit, the wire-bonded chip used in a power device, and every side of the heat sink except the bottom side, and also seals a portion of the leadframe of the control unit, and the wire-bonded chip used in a control device.

2. The intelligent power module package of claim 1, wherein the down-set region of the leadframe of the power unit has a depth in the range of 1–2 mm.

3. The intelligent power module package of claim 1, wherein the up-set region of the leadframe of the control unit has a height in the range of 0.5–1 mm.

4. The intelligent power module package of claim 1, wherein the heat sink is bonded during the manufacture of the leadframe.

5. The intelligent power module package of claim 1, wherein the heat sink is bonded during a molding process.

6. The intelligent power module package of claim 1, wherein the heat sink is made of one selected from a metal and a ceramic, containing Al or Cu.

7. The intelligent power module package of claim 1, wherein the insulating layer of the heat sink is made of one selected from polyimide and epoxy.

8. The intelligent power module package of claim 1, wherein the leadframe of the control unit is stacked on the leadframe of the power unit during a molding process.

9. The intelligent power module package of claim 1, wherein the leadframe of the control unit is electrically connected to the leadframe of the power unit during a soldering process.

10. An intelligent power module package comprising a semiconductor package of a power unit and a semiconductor package of a control unit,
    wherein the semiconductor package of a power unit comprises:
        a leadframe having a a down-set region and leads formed in both of its directions;
        a heat sink which is bonded to the a down-set region of the leadframe by interposing an insulating layer between the heat sink and the bottom side of the leadframe;
        a chip used in a power device which is bonded to a chip pad on the a down-set region of the leadframe;
        wires which connect the chip used in a power device and the leads of the leadframe;
        a sealing material which seals a portion of the leadframe, the chip used in a power device, the wires, and every side of the heat sink except the bottom side, and has a space and a locking means where a semiconductor package of a control unit can be bonded; and
    the semiconductor package of a control unit comprises:
        a leadframe having an up-set region and a lead formed in one direction;
        a chip used in a control device which is bonded to a chip pad on the raised region of the leadframe;
        wires which connect the chip used in a power device and the lead of the leadframe;
        a sealing material which seals the chip used in a control device and the wires and has a locking means where the semiconductor package of a power unit can be bonded.

11. The intelligent power module package of claim 10, wherein the a down-set region of the leadframe in the semiconductor package of the power unit has a depth in the range of 1–2 mm.

12. The intelligent power module package of claim 10, wherein the raised region of the leadframe in the semiconductor package of the control unit has a height in the range of 0.5–1 mm.

13. The intelligent power module package of claim 10, wherein the semiconductor package of the power unit and the semiconductor package of the control unit are manufactured separately from each other and subsequently are integrated into one semiconductor package by a combination process.

14. The intelligent power module package of claim 10, wherein the heat sink in the semiconductor package of the power unit is made of one selected from a metal and a ceramic containing Cu or Al.

15. The intelligent power module package of claim 10, wherein the insulating layer on the heat sink in the semiconductor package of the power unit is made of one selected from polyimide and epoxy.

16. The intelligent power module package of claim 13, wherein the combination process is performed after the leads are processed by a trimming/forming process and an electric property test.

17. The intelligent power module package of claim 10, wherein the lead of the semiconductor package of the power unit and the lead of the semiconductor package of the control unit are electrically connected with each other.

18. The intelligent power module package of claim 17, wherein the electrical connection process is performed using an alloy consisting of Pb and Sn, used in a solder process.

* * * * *